United States Patent
Aisenbrey

(10) Patent No.: US 7,006,046 B2
(45) Date of Patent: Feb. 28, 2006

(54) LOW COST ELECTRONIC PROBE DEVICES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 0 days.

(21) Appl. No.: 10/869,450

(22) Filed: Jun. 16, 2004

(65) Prior Publication Data
US 2004/0239570 A1 Dec. 2, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,776, filed on Jun. 16, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01Q 1/02* (2006.01)
*G01R 4/08* (2006.01)

(52) U.S. Cl. ..................... 343/703; 343/702

(58) Field of Classification Search .......... 343/703, 343/702, 700 MS, 846, 841; H01Q 1/02; G01R 4/08
See application file for complete search history.

(56) References Cited

U.S. PATENT DOCUMENTS

| | | | |
|---|---|---|---|
| 3,367,186 A | * | 2/1968 | Allen et al. .......... 374/165 |
| 4,126,126 A | | 11/1978 | Bare et al. .......... 128/2.06 E |
| 4,341,992 A | * | 7/1982 | Goldstein .......... 324/693 |
| 5,574,769 A | | 11/1996 | Clement .......... 379/21 |
| 6,250,802 B1 | | 6/2001 | Dotan .......... 374/164 |

(Continued)

FOREIGN PATENT DOCUMENTS

GB 2377449 A 1/2003

(Continued)

OTHER PUBLICATIONS

Co-pending U.S. Patent App. INT-01-002-CIP to Aisenbrey, filed Dec. 4, 2002, U.S. Appl. No. 10/309,429, assigned to the same assignee.

*Primary Examiner*—Hoanganh Le
(74) *Attorney, Agent, or Firm*—George O. Saile; Stephen B. Ackerman; Douglas R. Schnabel

(57) ABSTRACT

Electronic probe devices are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

36 Claims, 9 Drawing Sheets

U.S. PATENT DOCUMENTS

| | | |
|---|---|---|
| 2004/0095847 A1 | 5/2004 | Hassan et al. ............... 367/25 |
| 6,706,554 B1 | 3/2004 | Ogura ..................... 438/106 |
| 2004/0027129 A1 | 2/2004 | Cull ........................ 324/326 |

FOREIGN PATENT DOCUMENTS

JP          09021827     *   1/1997

* cited by examiner

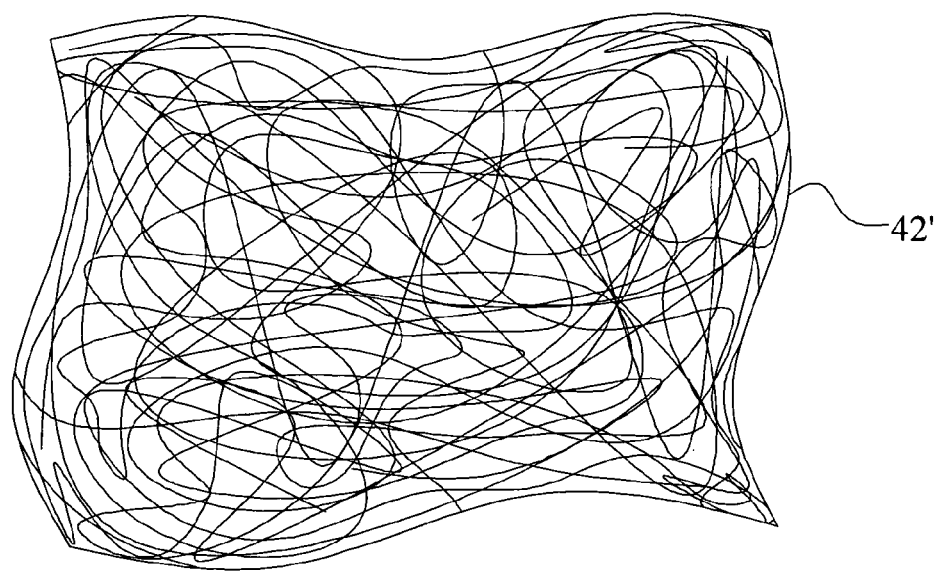
FIG. 5b
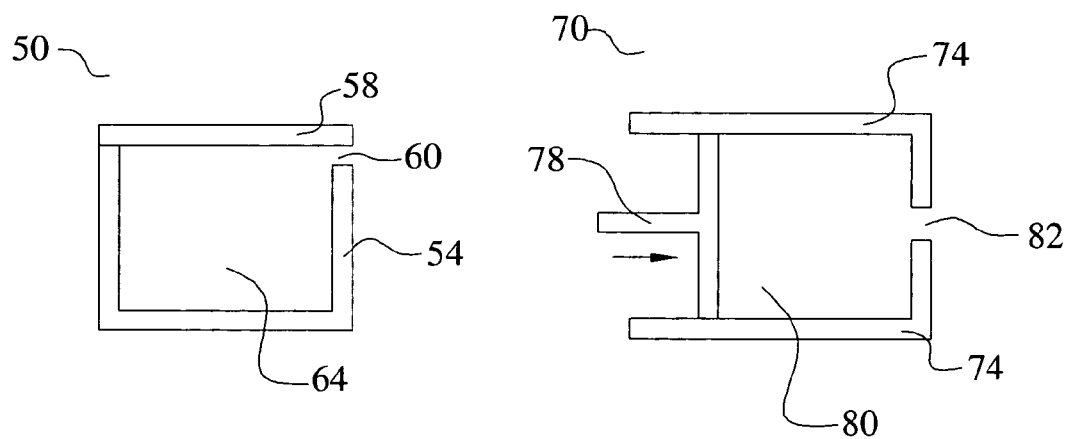
FIG. 6a
FIG. 6b

# LOW COST ELECTRONIC PROBE DEVICES MANUFACTURED FROM CONDUCTIVE LOADED RESIN-BASED MATERIALS This Patent Application claims priority to the U.S. Provisional Patent Application 60/478,776 filed on Jun. 16, 2003, which is herein incorporated by reference in its entirety.

This Patent Application is a Continuation-in-Part, filed as U.S. patent application Ser. No. 10/309,429, filed on Dec. 4, 2002, now U.S. Pat. No. 6,870,516 also incorporated by reference in its entirety, which is a Continuation-in-Part, filed as U.S. patent application Ser. No. 10/075,778, filed on Feb. 14, 2002, now U.S. Pat. No. 6,741,221 which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to electronic probe devices and, more particularly, to electronic probe devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Electronic probe devices are used for providing electrical connectivity between electric signals, such as voltages and currents, in electrical circuits and measuring instruments, such as voltage meters and oscilloscopes. Electronic probe devices are constructed to provide a signal path having impedance and bandwidth characteristics optimized to the device under test (DUT) and to the testing instrument. For example, probes used in oscilloscope analysis typically have very high impedance such that the probe minimally disturbs the operating signal in the DUT. Conversely, a probe for an ohmmeter instrument has very low impedance such that a precise reading of a resistance value between a set of probes is possible. Other probe characteristics that are of concern in the art include matching the impedance of the probe path and the signal analyzer input, the effect of grounding connections and grounding loops, the effect of shielding in the probe and in cabling between the probe and the analyzing instrument, the effect of noise coupling, and the size and shape of probing contact points to the DUT.

Typically, electronic probe devices comprise metal for the probe contact points, signal path, and cabling. In addition, shielding structures in the probes and cabling typically comprise metal. Noise is easily coupled into prior art probe devices. This noise can interfere with accurate measurement and analysis of signal waveforms. A particular object of the present invention is to improve the noise cancellation of electronic probe devices.

Several prior art inventions relate to electronic probe devices. U.S. Pat. No. 5,574,769 to Clement teaches an inductive amplifier apparatus for detecting and amplifying an electrical tone conducted by one of a group of wires in order to identify and trace a particular wire and utilizes a probe tip comprising a conductive plastic. U.S. Pat. No. 6,706,554, B2 to Ogura teaches a method of probing semiconductor integrated circuit chips wherein the flat probe head comprises conductive resins or conductive plastics. U.S. Pat. No. 4,126,126 to Bare et al teaches a low cost electrode pad for used to detect biological or physiological electrical potentials in the human heart. This invention utilizes a non-conductive plastic coated with a conductive silver and silver chloride coating to render it conductive. U.S. Pat. No. 6,250,802 B1 to Dotan teaches an electronic thermometer with preheating capabilities that utilizes a (PTC) thermistor and a (NTC) thermistor embedded in a heat-conductive plastic comprising an epoxy resin and conductive particles and covered by an outer layer of an inert metal. U.S. patent application Ser. No. 2004/0095847 to Hassan et al teaches an apparatus and a method for measuring ultrasound drilling mud velocity. U.S. patent application Ser. No. 2004/0027129 to Cull teaches a subsurface pipeline inspection system. The system uses coils to transmit and to receive electromagnetic energy.

SUMMARY OF THE INVENTION

A principal object of the present invention is to provide effective electronic probe devices.

A further object of the present invention is to provide a method to form an electronic probe device.

A further object of the present invention is to provide an electronic probe device molded of conductive loaded resin-based materials.

A yet further object of the present invention is to provide a electronic probe device molded of conductive loaded resin-based material where the electrical or thermal characteristics can be altered or the visual characteristics can be altered by forming a metal layer over the conductive loaded resin-based material.

A yet further object of the present invention is to provide methods to fabricate an electronic probe device from a conductive loaded resin-based material incorporating various forms of the material.

A yet further object of the present invention is to provide an electronic probe device with improved noise cancellation.

A yet further object of the present invention is to fabricate an electronic probe device using a simplified manufacturing process.

A yet further object of the present invention is to provide a seismic or acoustical sensor.

In accordance with the objects of this invention, an electronic probing device is achieved. The device comprises a probe tip comprising a conductive loaded, resin-based material comprising conductive materials in a base resin host. An insulating layer surrounds the probe tip.

Also in accordance with the objects of this invention, an electronic probing device is achieved. The device comprises a probe tip comprising a conductive loaded, resin-based material comprising conductive materials in a base resin host. An insulating layer surrounds the probe tip. An electromagnetic field absorbing structure surrounds the insulating layer. The electromagnetic field absorbing structure comprises the conductive loaded, resin-based material.

Also in accordance with the objects of this invention, an electronic probing device is achieved. The device comprises a magnet and a conductive coil surrounding the magnet. Movement of the conductive coil with respect to the magnet generates current in the conductive coil. An enclosure contains the magnet and the conductive coil. The enclosure comprises a conductive loaded, resin-based material comprising conductive materials in a base resin host.

Also in accordance with the objects of this invention, a method to form an electronic probe device is achieved. The method comprises providing a conductive loaded, resin-based material comprising conductive materials in a resin-based host. The conductive loaded, resin-based material is molded into an electronic probe device.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold electronics probe devices of a conductive loaded resin-based material.

DESCRIPTION OF THE PREFERRED EMBODIMENTS

Figure 1A:
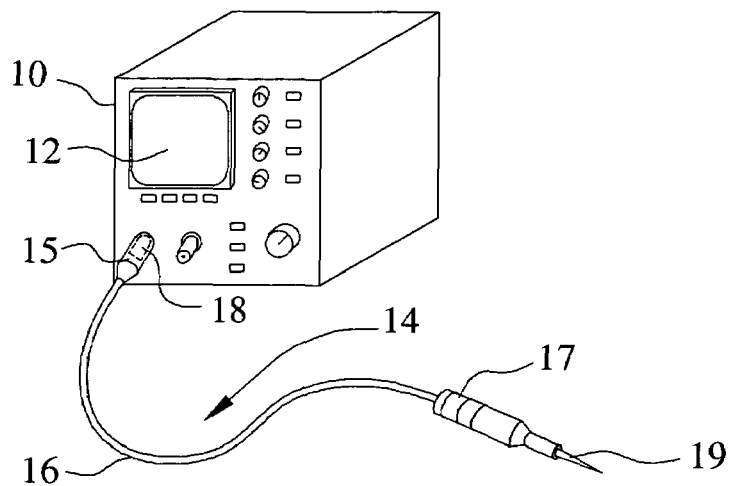
FIGS. 1a and 1b illustrate a first preferred embodiment of the present invention showing an electronic probe device comprising a conductive loaded resin-based material.

This invention relates to electronic probe devices molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electronic probe devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the electronic probe devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of electronic probe devices significantly lowers the cost of materials and the design and manufacturing processes used to hold ease of close tolerances, by forming these materials into desired shapes and sizes. The electronic probe devices can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, MA, a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the electronic probe devices and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming electronic probe devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electronic probe devices applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, electronic probe devices manufactured from the molded conductor loaded resin-based material can provide added thermal dissipation capabilities to the application. For example, heat can be dissipated from electrical devices physically and/or electrically connected to electronic probe devices of the present invention.

Figure 1B:
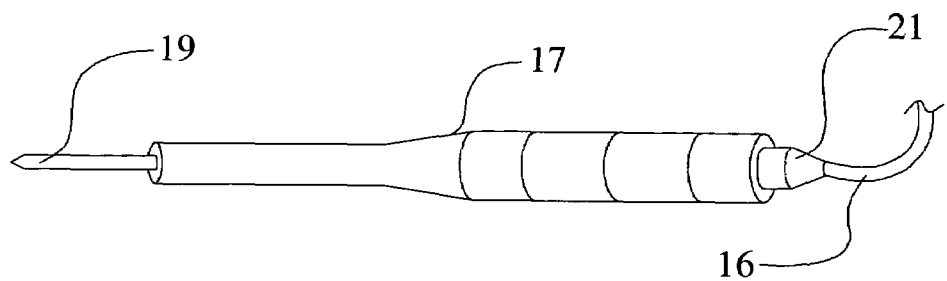

Referring now to FIGS. 1a and 1b, a first preferred embodiment of the present invention is illustrated. Several important features of the present invention are shown and discussed below. Referring now to FIG. 1a, an electrical measuring device 10 is shown. More specifically, an oscilloscope device 10 useful for display and analyzing electrical signals from an electrical circuit is illustrated. The oscilloscope 10 is connected to a device under test (DUT), not shown, by an electronics probe device 14. The probe device 14 comprises an operating probe 17 and 19, a conductive cable 16, and an input coupler 15. The operating probe 17 and 19 further comprises an operator handle 17 and a probing point 19. The probing point is electrically conductive and, in the case of a voltage probe, makes direct contact with the signal path in the DUT. In a current probe, the probe point comprises a conductive loop that is placed in near proximity to a signal path in the DUT. The operator handle comprises a non-conductive material that is designed for an operator to hold or manipulate without affecting the measurement. The conductive cable 16 provides a conductive path between the operating probe 17 and 19 and the coupling 15 at the analyzing device 10. Further, the conductive cable 16 provides adequate length and flexibility for reconfigurable measurement conditions. The coupling 15 mechanically and electrically attaches the cable 16 to the input channel 18 of the analyzer while allowing rapid connect/disconnect. Further, the coupling 15 may comprise an impedance structure or network to provide an impedance match between the electronic probe device 14 and the analyzer 10. The analyzer 10 provides a display to show measurement results, waveforms, and the like. The analyzing device 10 comprises analog and digital oscilloscopes, network analyzers, data acquisition units, voltage meters, current meters, spectrum analyzers, and the like. In addition, the analyzing device 10 may comprises an outputting device such as a signal generator, a waveform generator, a power supply, and the like.

Several important embodiments of the present invention may now be discussed in connection with FIG. 1a. As one embodiment of the present invention, the operating probe tip 19 comprises the conductive loaded resin-based material according to the present invention. This tip 19 is partially enclosed in the insulating handle 17. As another embodiment of the present invention, the core conductor within the cable 16 comprises the conductive loaded resin-based material. As another embodiment of the present invention, the coupling 15 comprises the conductive loaded resin-based material. As yet another embodiment of the present invention, an electromagnetic field absorbing structure of the conductive loaded resin-based material is inside of the handle 17. The electromagnetic field absorbing structure, not shown, surrounds the core conductor/tip 19. The electromagnetic field absorbing structure absorbs electromagnetic energy that would be coupled onto the probe tip 19 from extraneous sources. As yet another embodiment of the present invention, a similar conductive loaded resin-based electromagnetic field absorbing structure, not shown, surrounds the core conductor of the cable 16 to reduce noise coupling. As yet another embodiment of the present invention, the channel connectors 18 of the analyzing instrument 10 comprise the conductive loaded resin-based material of the present invention.

Referring now particularly to FIG. 1b, the operating probe is illustrated in greater detail. The operating probe comprises an operator handle 17, a probe tip 19, a tip-to-cable coupler 21, and a cable 16. In this embodiment, a single probe tip 19 is formed of the conductive loaded resin-based material. The probe tip 19 preferably traverses the length of the operating probe handle 17 such that a coupler 21 connects the probe tip material 19 to the core conductor of the cable 16. Alternatively, the coupler 21 connects the tip 19 and cable 16 at the tip end of the handle 17. In one embodiment, the probe tip 19 is formed by injection molding of the conductive loaded resin-based material. In another embodiment, the probe tip 19 is formed by extrusion molding. The handle provides an operator interface that is electrically isolated from the DUT and the probe tip 19. In one embodiment, the handle is over-molded onto the probe tip 19. Preferably, the handle 17 comprises a resin-based material and, more preferably, the handle 17 comprises the same base resin as is used in the conductive loaded resin-based probe tip 19. This composition will enhance the bonding between handle 17 and tip 19.

The cable 16 preferable comprises a core conductor of the conductive loaded resin-based material that has been extruded into a long wire-like conductor. In one embodiment, an insulating layer is co-extruded over the core conductor. Alternatively, this insulating layer is formed by spraying, dipping, or coating. In another embodiment, an electromagnetic field absorbing structure is formed overlying the core conductor with an insulating layer therebetween. Preferably, this electromagnetic field absorbing structure also comprises the conductive loaded resin-based material of the present invention.

Figure 7:
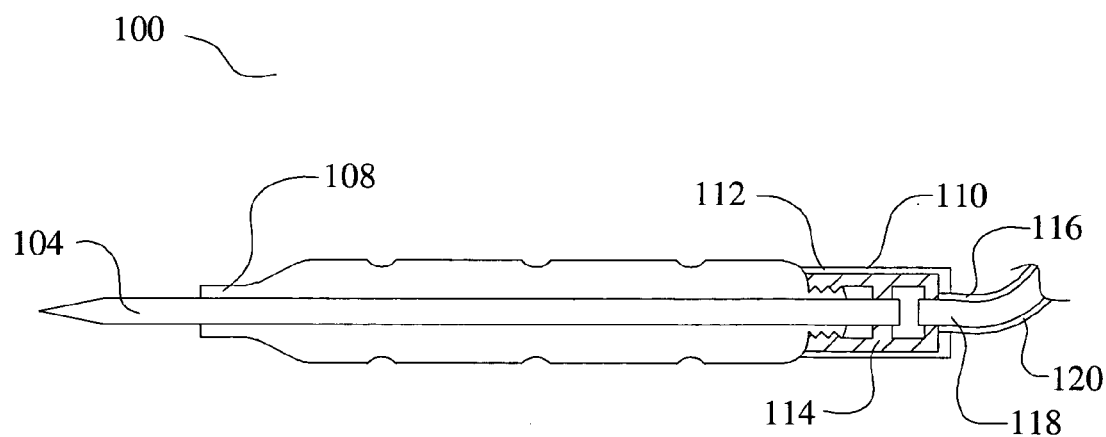
FIG. 7 illustrates a second preferred embodiment of the present invention showing an electronics probe device in cross sectional representation.

Referring now to FIG. 7, a second preferred embodiment of the present invention is illustrated. A cross section of the operating probe 100 of the present invention is shown. The operating probe comprises an operator handle 108, a probe tip 104, a tip-to-cable coupler 1102, and a cable 116. In this embodiment, a single probe tip 104 is formed of the conductive loaded resin-based material. The probe tip 104 preferably traverses the length of the operating probe handle 108 such that the coupler 110 connects the probe tip material 104 to the core conductor 118 of the cable 116. In this embodiment, the coupler 110 comprises a metal structure 114 encased in an insulator 112. The handle 108 provides an operator interface that is electrically isolated from the DUT and the probe tip 104. Preferably, the handle 108 comprises a resin-based material and, more preferably, the handle 108 comprises the same base resin as is used in the conductive loaded resin-based probe tip 104. The cable 116 preferable comprises a core conductor 118 of the conductive loaded resin-based material that has been extruded into a long wire. In this embodiment, an insulating layer 120 is formed over the core conductor 118.

In another embodiment, the operating probe 100 further comprise a metal layer, not shown, that is formed around the probe tip 104. This metal layer alters the conductive, thermal, or visual properties of the tip 104. If used, this metal layer may be formed by plating or by coating. If the method of formation is metal plating, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer may be formed by, for example, electroplating or physical vapor deposition.

Figure 8:
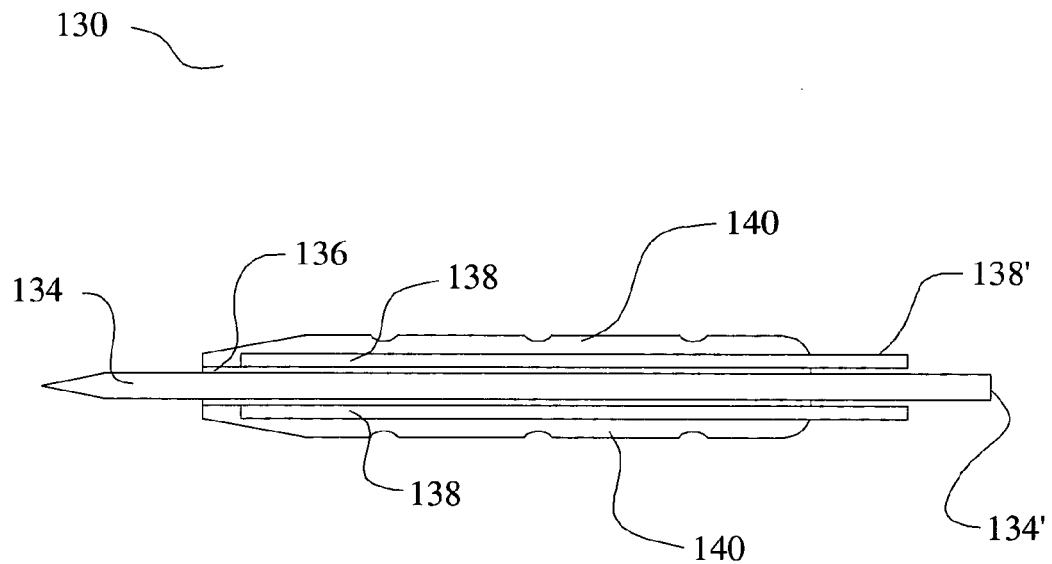
FIG. 8 illustrates a third preferred embodiment of the present invention showing a cross sectional representation of an electronics probe device with an electromagnetic field absorbing structure structure.

Referring now to FIG. 8, a third preferred embodiment 130 of the present invention is illustrated in cross section. In this embodiment 130, an electromagnetic field absorbing structure 138 is added to the operating probe 130. Again, the probe 130 comprises a probe tip 134 traversing the length of the body 130 and exposed for cable connection 134'. An insulating layer 136 is formed around the probe tip 134 throughout the length of the probe 130. In one embodiment, this insulating layer 136 comprises a resin that is over-molded onto the probe tip 134. In another embodiment, this insulating layer 136 comprises an insulating material that is sprayed, dipped, or coated onto the probe tip 134.

As an important feature, an electromagnetic field absorbing structure 138 is formed surrounding the insulating layer 138 and the probe tip 134. In one embodiment, this electromagnetic field absorbing structure 138 comprises the conductive loaded resin-based material of the present invention. The conductive loaded resin-based electromagnetic field absorbing structure 138 provides several important advantages to the operating probe 130 of the present invention. First, the electromagnetic field absorbing structure 138 is easily fabricated around the probe tip 134 and insulating layer 136 by over-molding or by extrusion molding. Second, the electromagnetic field absorbing structure 138 is coupled to a grounding wire in the cable, not shown, by means of the electromagnetic field absorbing structure extension 138'. Third, it is found that the conductive loaded resin-based electromagnetic field absorbing structure 138 provides excellent cancellation of noise. The conductive loaded resin-based material 138 is an excellent absorber of electromagnetic (EM) energy. The conductive loaded resin-based electromagnetic field absorbing structure 138 acts as an EMF absorber. This absorbed energy is shunted to ground though the ground connection 138'. It is found that the operating probe device 130 combining a conductive loaded resin-based probe tip 134 with a conductive loaded resin-based electromagnetic field absorbing structure 138 provides better noise cancellation than a comparable metal-based probe. The conductive loaded resin-based material has better absorption and controllable reflection qualities than metal shielding typically used in the prior art. In addition, it is found that the operating probe 130 of the present invention provides a larger operating frequency bandwidth than a comparable metal-based probe. The bandwidth is broader because of large surface area created within the large network within the conductive loaded resin-based probe tip. Finally, a handle 140 is formed over the probe tip 134, insulating layer 136, and electromagnetic field absorbing structure 138. Preferably, this handle 140 comprises an insulating, resin-based material that is over-molded onto the probe assembly 130.

Figure 9:
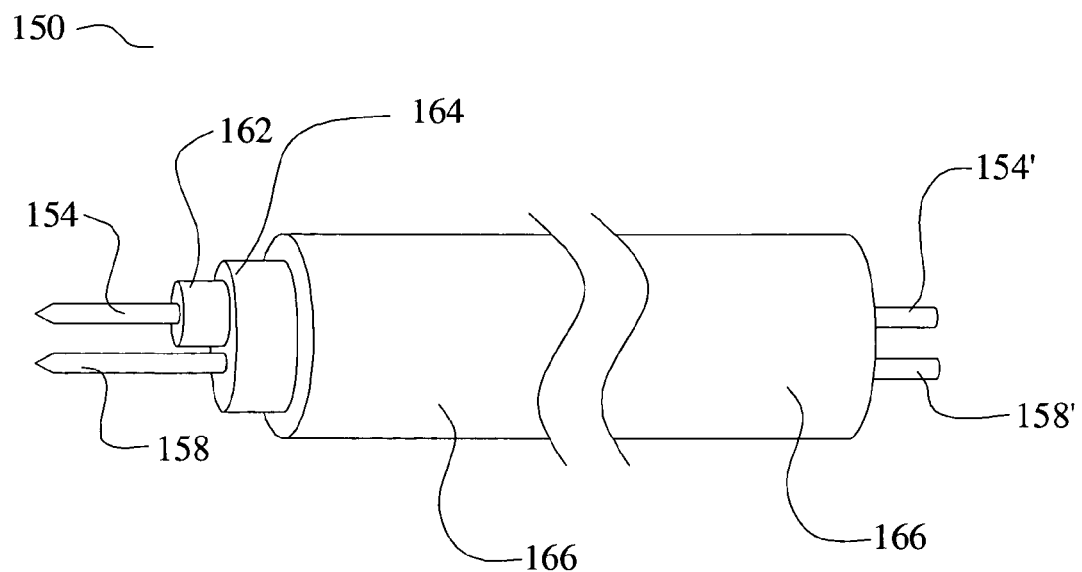
FIG. 9 illustrates a fourth preferred embodiment of the present invention showing a cross sectional representation of an electronics probe device with a grounding pin and an electromagnetic field absorbing structure.

Referring now to FIG. 9, a fourth preferred embodiment 150 of the present invention is illustrated. In this embodiment, a electromagnetic field absorbing probe tip 158 is provided for connecting the electromagnetic field absorbing structure 164 directly to a signal in the DUT. Again, a signal probe tip 154 is preferably formed of the conductive loaded resin-based material. This signal probe tip 154 traverses the length of the operating probe 150 and emerges as a connection terminal 154' for the cable. An insulating layer 162 is again formed surrounding the signal probe tip 154. As an important feature of this embodiment, however, a electromagnetic field absorbing structure probe tip 158 is embedded in the electromagnetic field absorbing structure 164 that surrounds the insulating layer 162 and the signal probe tip 154. The electromagnetic field absorbing structure probe tip 158 traverses the length of the operating probe 150 and emerges as a connection terminal 158' for the cable. In one embodiment, the electromagnetic field absorbing structure probe tip 158 comprises the conductive loaded resin-based material. In another embodiment, the electromagnetic field absorbing structure 164 that surrounds both the electromagnetic field absorbing structure probe tip 158 and the signal probe tip 154 comprises the conductive loaded resin-based material. In yet another embodiment, both the electromagnetic field absorbing structure probe tip 158 and the electromagnetic field absorbing structure layer 162 comprise the conductive loaded resin-based material. Preferably, after the insulating layer 162 is formed around the signal probe tip 154, the electromagnetic field absorbing structure probe 158 is run parallel to the insulating layer 162 and the signal probe tip 154 and then the electromagnetic field absorbing structure 164 is extruded thereover. As a result, an electrical connection to a signal, such as the ground reference, of the DUT is used to provide a shunting path for the conductive loaded resin-based electromagnetic field absorbing structure 164. Finally, a handle 166 is formed around the electromagnetic field absorbing structure 164 to complete the operating probe 150. Preferably, the handle comprises a resin-based material that is over-molded onto the electromagnetic field absorbing structure 164.

Figure 10:
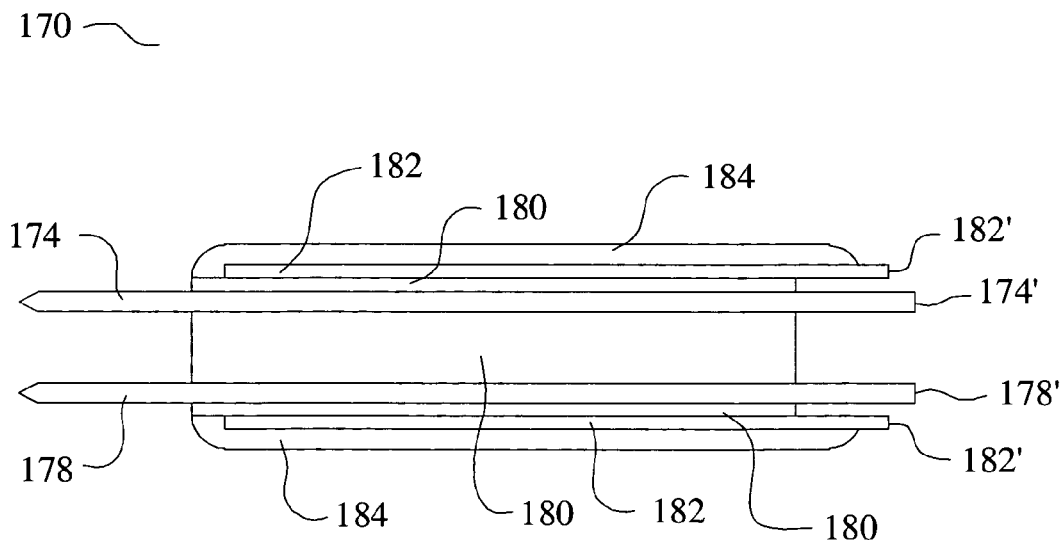
FIG. 10 illustrates a fifth preferred embodiment of the present invention showing a cross sectional representation of an electronics probe device with differential probes and an electromagnetic field absorbing structure.

Referring now to FIG. 10, a fifth preferred embodiment 170 of the present invention is illustrated. In this embodiment, a differential probe 170 is shown in cross section. First and second probe tips 174 and 178 traverse the length of the operating probe 170 and emerge as terminals 174' and 178'. In one embodiment, the first and second probe tips 174 and 178 comprises the conductive loaded resin-based material of the present invention. An insulating layer 180 surrounds the first and second probe tips 174 and 178. In one embodiment, the insulating layer 180 comprises a resin-based material that is molded onto the probe tips 174 and 178. The insulating layer 180 provides structural support for, and electrical separation of, the probe tips 174 and 178. A electromagnetic field absorbing structure 182 surrounds the insulating layer 180 and probe tips 182. The electromagnetic field absorbing structure also traverses the length of the operating probe and emerges as terminal connections 182' for the cable. In one embodiment, the electromagnetic field absorbing structure 182 comprises the conductive loaded resin-based material of the present invention. Preferably, the electromagnetic field absorbing structure 182 is over-molded onto the insulating layer 180. Finally, a handle 184, surrounds the electromagnetic field absorbing structure 182. In one embodiment, the handle 184 comprises a resin-based material that is over-molded onto the operating probe 170.

Figure 11:
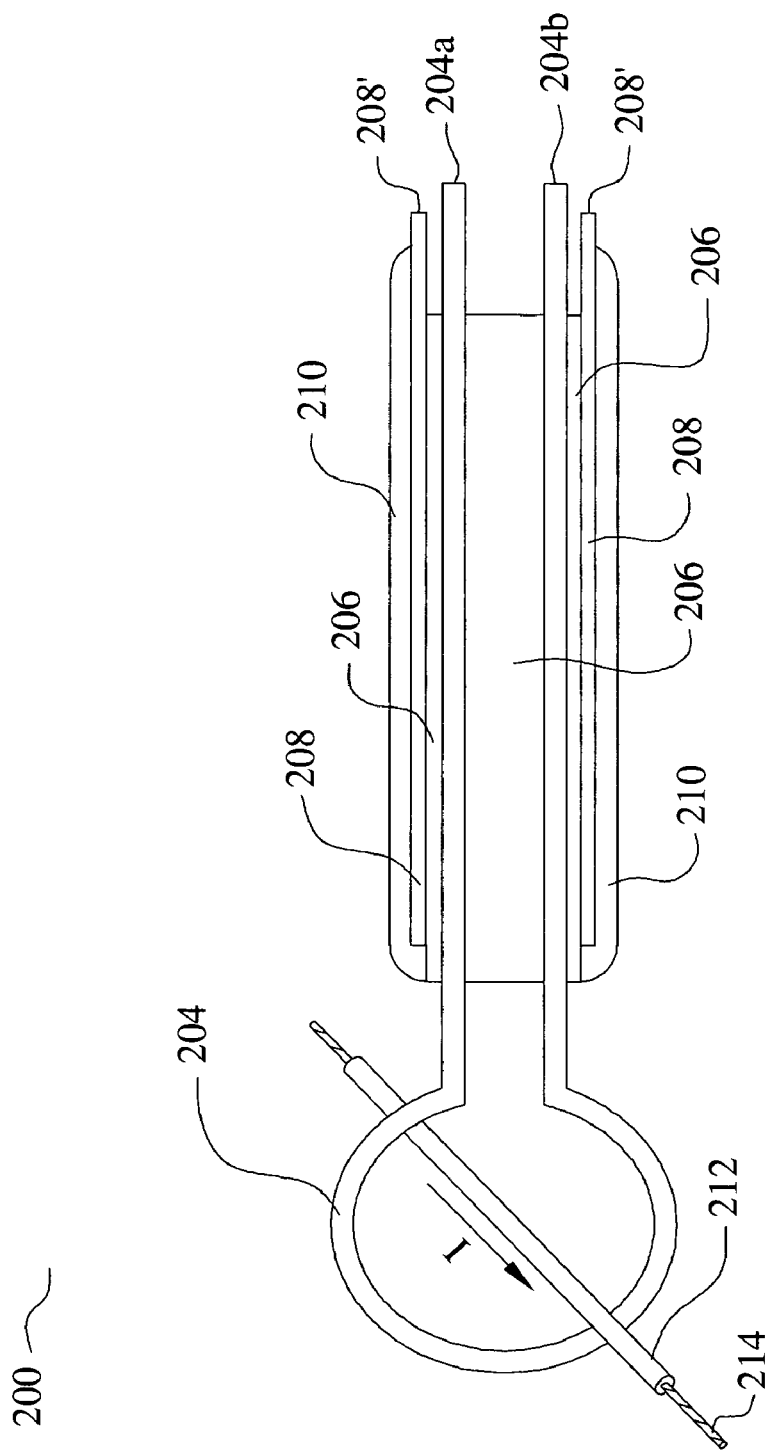
FIG. 11 illustrates a sixth preferred embodiment of the present invention showing a cross sectional representation of an electronics probe device for measuring current.

Referring now to FIG. 11, a sixth preferred embodiment of the present invention is illustrated. A current probe device 200 is shown in cross sectional representation. In a current probe device, the current (I) flowing in a conductor 212 is measured using an indirect technique. In this case, a wire 212 comprises a core conductor 214 encased in an insulator. The current probe device 200 comprises a conductor loop 204. The conducting wire 212 is placed inside of the conductor loop 204 of the probe 200. Current flow in the conducting wire 212 will generate a magnetic field emanating from the wire 212. In turn, this magnetic field will interact with the conductive loop 204 of the probe 200. For example, eddy currents may be generated in the loop 204 and transferred to the cable, not shown, via terminals 204a and 204b. Measurements of the induced current flow in the loop 204 can be used to calculate the actual current flow in the wire 212.

In one embodiment, the conductive loop 204 comprises the conductive loaded resin-based material of the present invention. The conductive loaded resin-based material efficiently absorbs electromagnetic energy emanating from the wire 212 and has high conductivity to thereby convert this energy into loop current. An insulating layer 206 surrounds the conductive loop 204. In one embodiment, the insulating layer 206 comprises a resin-based material that is molded onto the conductive loop 204. The insulating layer 206 provides structural support for, and electrical separation of, the legs of conductive loop 204. An electromagnetic field absorbing structure 208 surrounds the insulating layer 206 and conductive loop 204. The electromagnetic field absorbing structure 208 also traverses the length of the operating probe 200 and emerges as terminal connections 208' for the cable. In one embodiment, the electromagnetic field absorbing structure 208 comprises the conductive loaded resin-based material of the present invention. Preferably, the electromagnetic field absorbing structure 208 is over-molded onto the insulating layer 206. Finally, a handle 210, surrounds the electromagnetic field absorbing structure 208. In one embodiment, the handle 210 comprises a resin-based material that is over-molded onto the operating probe 200.

Figure 12:
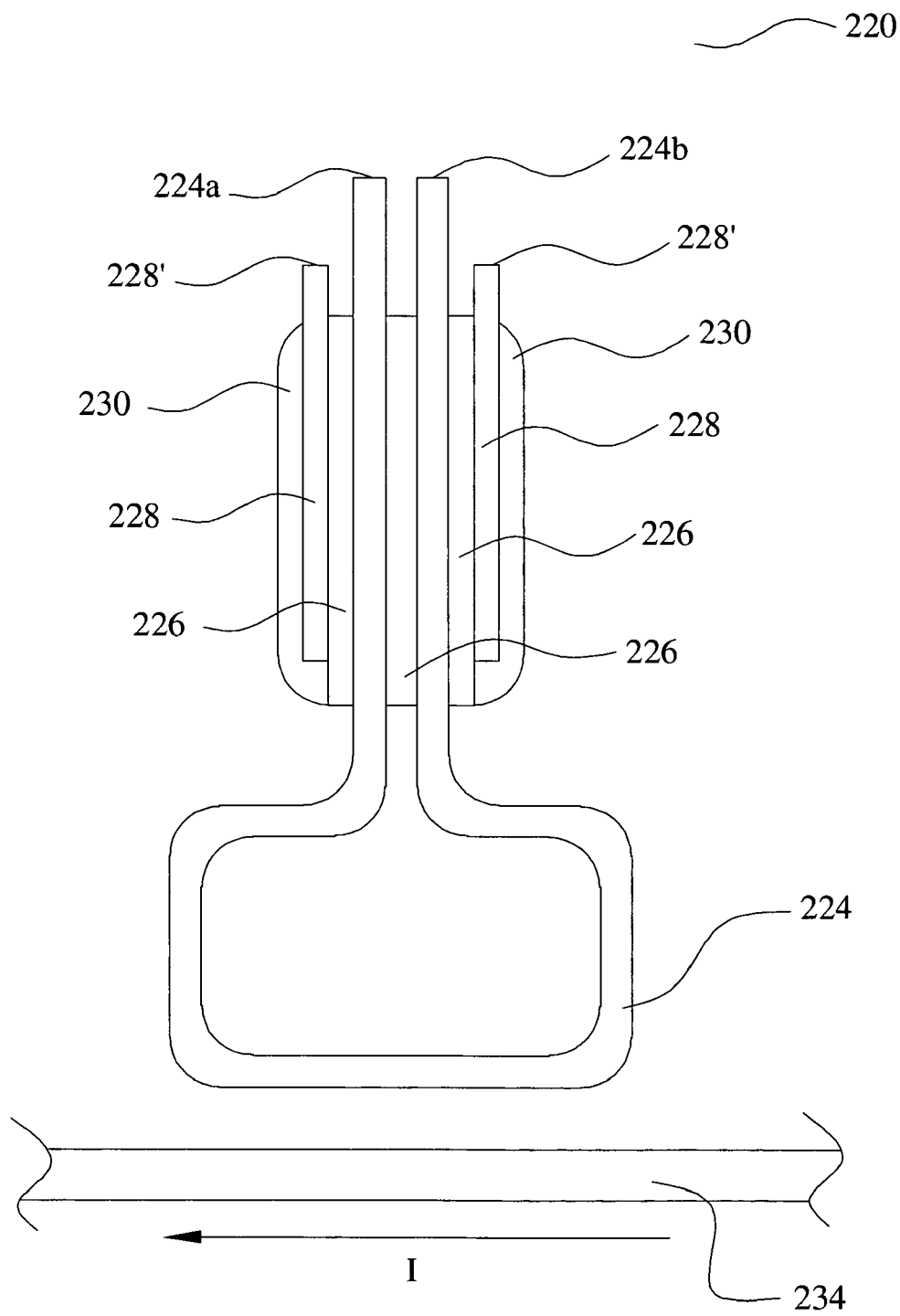
FIG. 12 illustrates a seventh preferred embodiment of the present invention showing a cross sectional representation of an electronics probe device for measuring current.

Referring now to FIG. 12, a seventh preferred embodiment of the present invention is illustrated. Another current probe device 220 is shown in cross sectional representation. Again, the current (I) flowing in a conductor 234 is measured using an indirect technique. In this case, the conducting wire 234 is placed in near proximity to the conductor loop 224 of the probe 220. Current flow in the conducting wire 234 will generate a magnetic field emanating from the wire 234. In turn, this magnetic field will interact with the conductive loop 224 of the probe 220 to generate loop currents that are transferred to the cable, not shown, via terminals 224a and 224b

In one embodiment, the conductive loop 224 comprises the conductive loaded resin-based material of the present invention. The conductive loaded resin-based material efficiently absorbs electromagnetic energy emanating from the wire 234 and has high conductivity to thereby convert this energy into loop current. An insulating layer 226 surrounds the conductive loop 224. In one embodiment, the insulating layer 226 comprises a resin-based material that is molded onto the conductive loop 224. The insulating layer 226 provides structural support for, and electrical separation of, the legs of conductive loop 224. A electromagnetic field absorbing structure 228 surrounds the insulating layer 226 and conductive loop 224. The electromagnetic field absorbing structure 228 also traverses the length of the operating probe 220 and emerges as terminal connections 228' for the cable. In one embodiment, the electromagnetic field absorbing structure 228 comprises the conductive loaded resin-based material of the present invention. Preferably, the electromagnetic field absorbing structure 228 is over-molded onto the insulating layer 226. Finally, a handle 230, surrounds the electromagnetic field absorbing structure 228. In one embodiment, the handle 230 comprises a resin-based material that is over-molded onto the operating probe 220.

Figure 13:
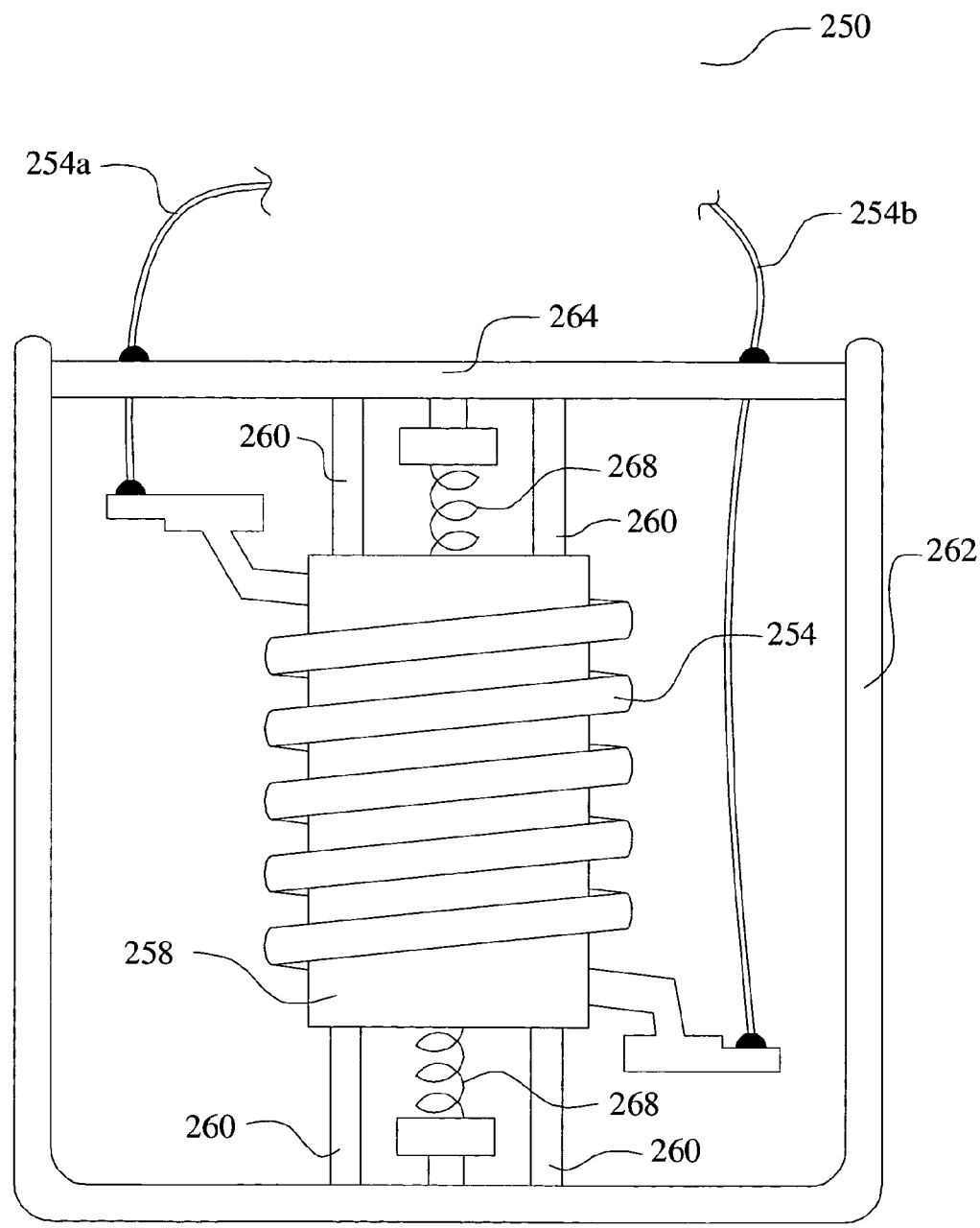
FIG. 13 illustrates an eighth preferred embodiment of the present invention showing a cross sectional representation of an electronics probe device for measuring seismic or vibration activity.

Referring now to FIG. 13, an eighth preferred embodiment of the present invention is illustrated. An acoustical probe 250, or geophone, useful for making seismic or acoustical measurements is shown in simplified schematic form. The acoustical probe 250 comprises a coil 254 suspended between spring mechanisms 268 attached between the enclosure 262 and lid 264. A permanent magnet 258 is fixably mounted 260 between the enclosure 262 and the lid 264 such that the coil 254 surrounds the permanent magnet 258. In operation, acoustical waves or seismic movements will cause the coil 254 to move with respect to the fixed position of the magnet 258. As a result, current is induced in the coil 254. This current is monitored at the coil terminations 254a and 254b. Analysis of the current in the coil 254 is used to calculate the magnitude and duration of acoustical waves or seismic activity. In the preferred embodiment, enclosure 262 comprises the conductive loaded resin-based material of the present invention. The conductive loaded resin-based material is easy molded into the enclosure shape. In addition, the lid 264 is easily molded from a resin-based material. An excellent seal between the lid 264 and the conductive loaded resin-based enclosure 262 is accomplished due to the similarity of materials.

Figure 2:
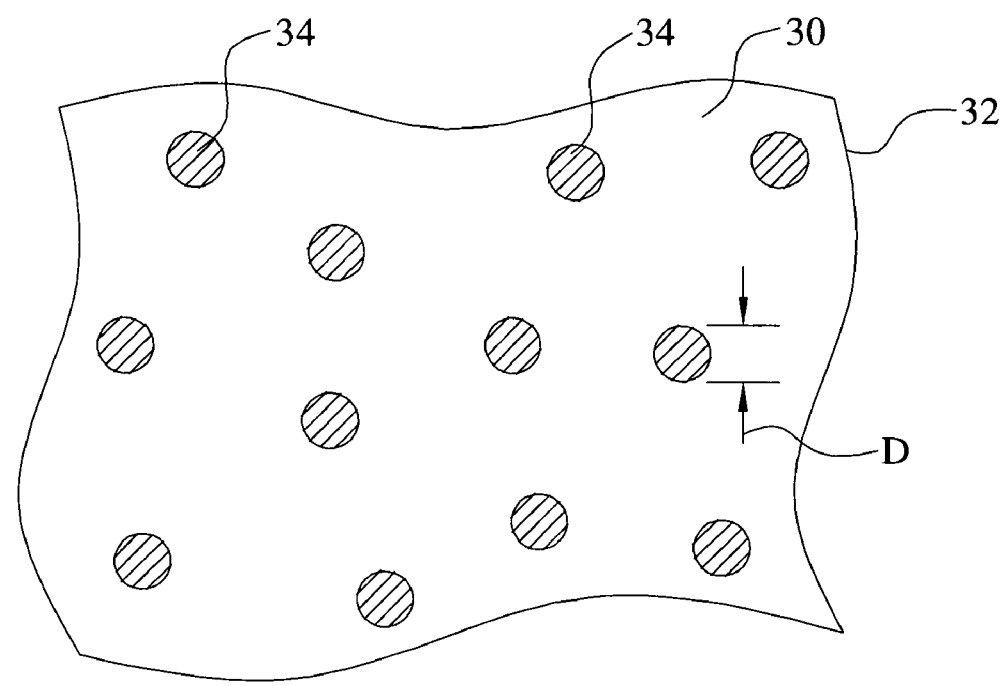
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
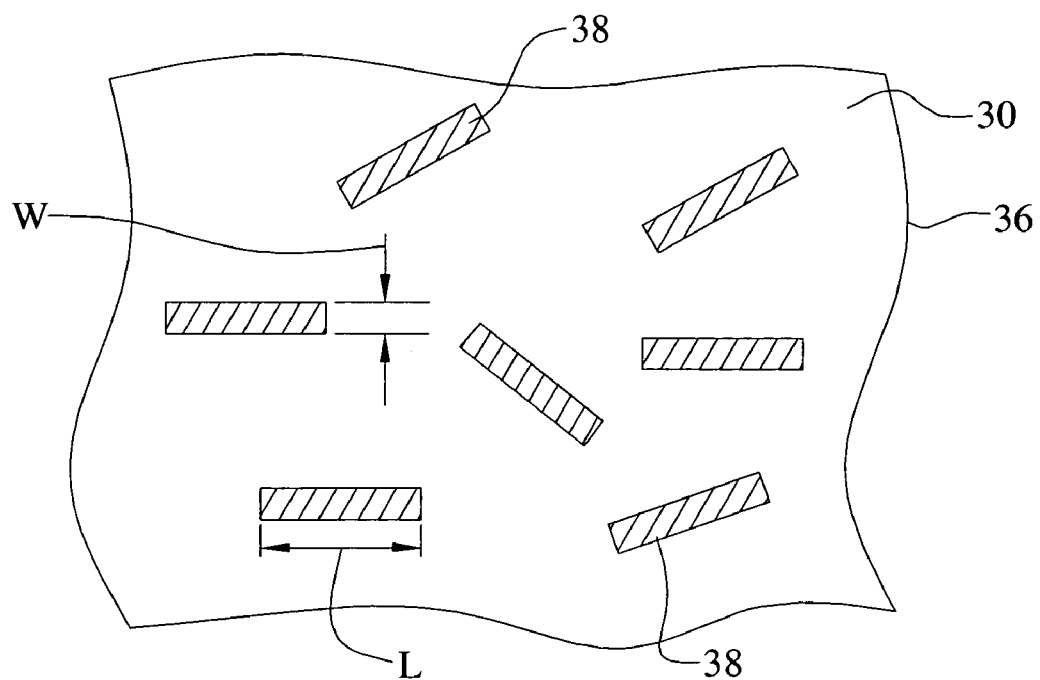
FIG. 3 illustrates a second preferred embodiment of a conductive loaded resin-based material wherein the conductive materials comprise micron conductive fibers.
Figure 4:
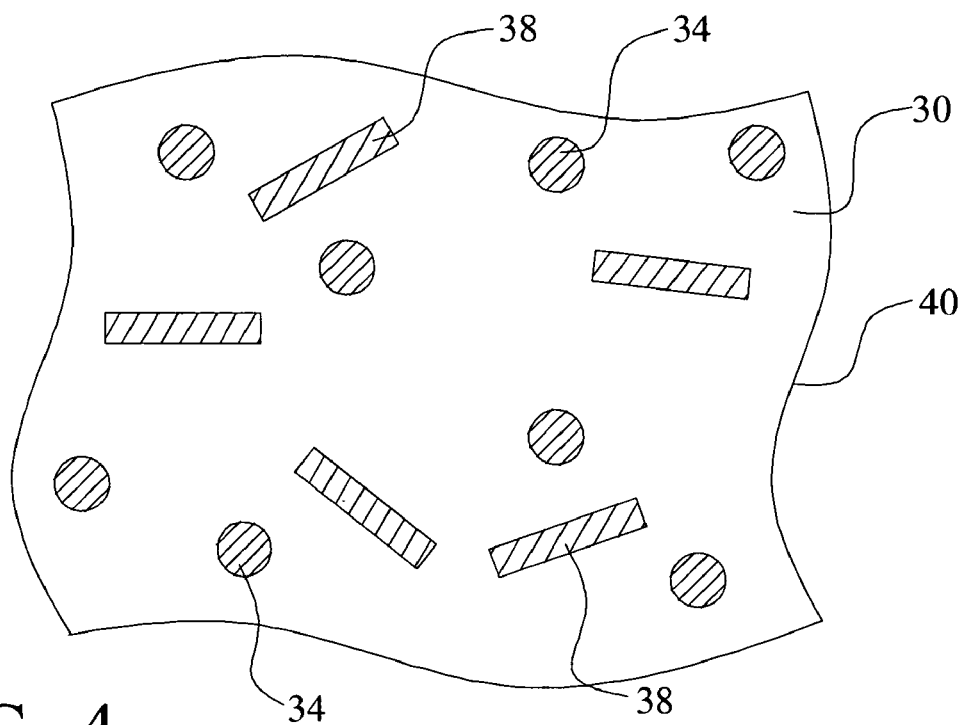
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
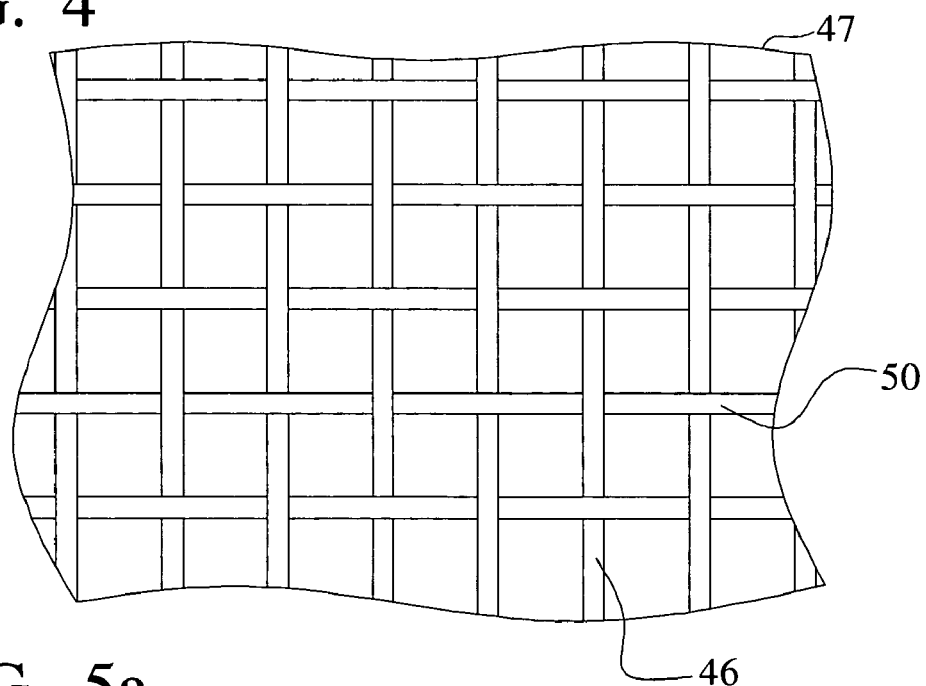

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Electronic probe devices formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the electronic probe devices are removed.

FIG. 6b shows a simplified schematic diagram of an extruder 70 for forming electronic probe devices using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. An effective electronic probe device is achieved. A method to form an electronic probe device is achieved. An electronic probe device is molded of conductive loaded resin-based materials. An electronic probe device is molded of conductive loaded resin-based material where the electrical or thermal characteristics can be altered or the visual characteristics can be altered by forming a metal layer over the conductive loaded resin-based material. Methods to fabricate an electronic probe device from a conductive loaded resin-based material incorporating various forms of the material are achieved. An electronic probe device with improved noise cancellation is achieved. The electronic probe device is fabricated using a simplified manufacturing process. A seismic or acoustical sensor is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An electronic probing device comprising:
    a probe tip comprising a conductive loaded, resin-based material comprising micron conductive fiber in a base resin host; and
    an insulating layer surrounding said probe tip.

2. The device according to claim 1 wherein the ratio, by weight, of said micron conductive fiber to said resin host is between about 0.20 and about 0.40.

3. The device according to claim 1 wherein said conductive loaded resin-based material further comprises metal powder.

4. The device according to claim 3 wherein said metal powder is nickel, copper, silver, or is a material plated with nickel, copper, or silver.

5. The device according to claim 3 wherein said metal powder comprises a diameter of between about 3 µm and about 12 µm.

6. The device according to claim 1 wherein said conductive loaded resin-based material further comprises non-metal powder.

7. The device according to claim 6 wherein said nonmetal powder is carbon, graphite, or an amine-based material.

8. The device according to claim 1 wherein said conductive loaded resin-based material further comprises a combination of metal powder and non-metal powder.

9. The device according to claim 1 wherein said micron conductive fiber is nickel plated carbon fiber, stainless steel fiber, copper fiber, silver fiber or combinations thereof.

10. The device according to claim 1 wherein said micron conductive fiber pieces each have a diameter of between about 3 µm and about 12 µm and a length of between about 2 mm and about 14 mm.

11. The device according to claim 1 further comprising a metal layer overlying said probe tip.

12. The device according to claim 1 further comprising a an electromagnetic field absorbing structure surrounding said insulating layer.

13. The device according to claim 12 wherein said electromagnetic field absorbing structure comprises said conductive loaded, resin-based material.

14. The device according to claim 12 further comprising a grounding conductor embedded in said electromagnetic field absorbing structure.

15. The device according to claim 14 wherein said grounding conductor comprises said conductive loaded, resin-based material.

16. The device according to claim 14 wherein said grounding conductor is a second probe tip.

17. The device according to claim 12 further comprising a handle surrounding said electromagnetic field absorbing structure.

18. The device according to claim 17 wherein said handle comprises a resin-based material.

19. The device according to claim 1 further comprising at least one additional probe tip wherein said probe tip comprises said conductive loaded, resin-based material and wherein said insulating layer also surrounds said additional probe tip.

20. The device according to claim 19 further comprising an electromagnetic field absorbing structure surrounding said insulating layer.

21. The device according to claim 20 wherein said electromagnetic field absorbing structure comprises said conductive loaded, resin-based material.

22. The device according to claim 21 further comprising a grounding conductor embedded in said electromagnetic field absorbing structure.

23. The device according to claim 22 wherein said grounding conductor comprises said conductive loaded, resin-based material.

24. An electronic probing device comprising:
    a probe tip comprising a conductive loaded, resin-based material comprising micron conductive fiber in a base resin host;
    an insulating layer surrounding said probe tip; and
    an electromagnetic field absorbing structure surrounding said insulating layer wherein said electromagnetic field absorbing structure comprises said conductive loaded, resin-based material.

25. The device according to claim 24 wherein the ratio, by weight, of said micron conductive fiber to said resin host is between about 0.20 and about 0.40.

26. The device according to claim 24 wherein said conductive loaded resin-based materials further comprise metal powder.

27. The device according to claim 24 wherein said conductive loaded resin-based materials comprise non-metal powder.

28. The device according to claim 24 wherein said conductive loaded resin-based materials further comprise a combination of metal powder and nonmetal powder.

29. The device according to claim 24 further comprising a grounding conductor embedded in said electromagnetic field absorbing structure.

30. The device according to claim 29 wherein said grounding conductor comprises said conductive loaded, resin-based material.

31. The device according to claim 29 wherein said grounding conductor is a second probe tip.

32. The device according to claim 24 further comprising a handle surrounding said electromagnetic field absorbing structure.

33. The device according to claim 32 wherein said handle comprises a resin-based material.

34. The device according to claim 24 further comprising at least one additional probe tip wherein said probe tip comprises said conductive loaded, resin-based material and wherein said insulating layer also surrounds said additional probe tip.

35. The device according to claim 34 further comprising a grounding conductor embedded in said electromagnetic field absorbing structure.

36. The device according to claim 35 wherein said grounding conductor comprises said conductive loaded, resin-based material.

* * * * *